US009735307B2

(12) United States Patent
Kondou et al.

(10) Patent No.: US 9,735,307 B2
(45) Date of Patent: Aug. 15, 2017

(54) METHOD OF MANUFACTURING THIN-FILM SOLAR CELL

(71) Applicant: Solar Frontier K.K., Tokyo (JP)

(72) Inventors: Masashi Kondou, Tokyo (JP); Manabu Tanaka, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 13 days.

(21) Appl. No.: 14/423,169

(22) PCT Filed: Aug. 29, 2013

(86) PCT No.: PCT/JP2013/073119
§ 371 (c)(1),
(2) Date: Feb. 23, 2015

(87) PCT Pub. No.: WO2014/038462
PCT Pub. Date: Mar. 13, 2014

(65) Prior Publication Data
US 2015/0243830 A1    Aug. 27, 2015

(30) Foreign Application Priority Data
Sep. 10, 2012  (JP) .................... 2012-198904

(51) Int. Cl.
*H01L 21/00*    (2006.01)
*H01L 31/18*    (2006.01)
(Continued)

(52) U.S. Cl.
CPC ...... *H01L 31/18* (2013.01); *H01L 31/022441* (2013.01); *H01L 31/022466* (2013.01);
(Continued)

(58) Field of Classification Search
CPC .................. H01L 31/18; H01L 31/068; H01L 31/022441; H01L 31/1884;
(Continued)

(56) References Cited

U.S. PATENT DOCUMENTS

2007/0163646 A1   7/2007  Kushiya et al.
2011/0259417 A1*  10/2011  Toyokawa ......... B23K 26/0876
                                                                136/256
(Continued)

FOREIGN PATENT DOCUMENTS

DE    102010013253    9/2011
EP       1544172       6/2005
(Continued)

OTHER PUBLICATIONS

International Search Report mailed on Nov. 19, 2013.
Extended European Search Report mailed Aug. 25, 2015.

*Primary Examiner* — Julio J Maldonado
*Assistant Examiner* — Stanetta Isaac
(74) *Attorney, Agent, or Firm* — IPUSA, PLLC

(57) ABSTRACT

A method of manufacturing a thin-film solar cell includes forming a first electrode on a substrate; forming a first petition groove for dividing the first electrode; forming a semiconductor layer on the first electrode and in the first partition groove; forming a second partition groove for dividing the semiconductor layer; forming a second electrode on the semiconductor layer and in the second partition groove; and forming a third partition groove for dividing the second electrode and the semiconductor layer. At least one of the steps of forming the first partition groove, the second partition groove, and the third partition groove includes forming an opening in a partition groove forming layer to expose a lower layer surface below the partition groove forming layer, bringing a needle into contact with the lower layer surface, and forming the partition groove by moving the needle in a predetermined direction.

7 Claims, 10 Drawing Sheets

(51) Int. Cl.
  *H01L 31/0465* (2014.01)
  *H01L 31/04* (2014.01)
  *H01L 31/0463* (2014.01)
  *H01L 31/0224* (2006.01)
  *H01L 31/068* (2012.01)

(52) U.S. Cl.
  CPC .......... *H01L 31/04* (2013.01); *H01L 31/0463* (2014.12); *H01L 31/0465* (2014.12); *H01L 31/068* (2013.01); *H01L 31/1884* (2013.01); *Y02E 10/50* (2013.01); *Y02P 70/521* (2015.11)

(58) Field of Classification Search
  CPC ......... H01L 31/022466; H01L 31/0463; H01L 31/04; H01L 31/0465; H01L 31/0296; Y02P 70/521; Y02E 10/541; Y02E 10/543
  USPC ..................................... 438/93; 257/E21.009
  See application file for complete search history.

(56) References Cited

U.S. PATENT DOCUMENTS

| | | | |
|---|---|---|---|
| 2011/0278267 | A1 | 11/2011 | Kawakami |
| 2013/0255760 | A1* | 10/2013 | Kim .................... H01L 31/0468 136/256 |
| 2014/0137931 | A1* | 5/2014 | Shin .................. H01L 31/02167 136/256 |
| 2014/0338751 | A1* | 11/2014 | Kim .................. H01L 21/02422 136/265 |

FOREIGN PATENT DOCUMENTS

| | | |
|---|---|---|
| EP | 2368662 | 9/2011 |
| JP | 2000-261020 | 9/2000 |
| JP | 2004-327901 | 11/2004 |
| JP | 2005-191167 | 7/2005 |

* cited by examiner

FIG.4
(a)
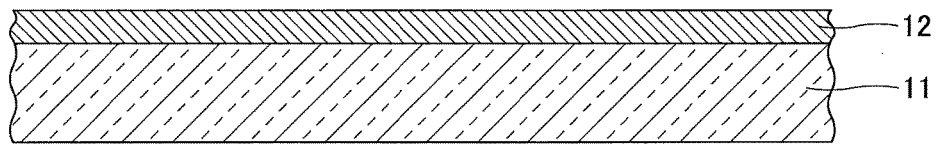
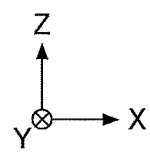
(b)
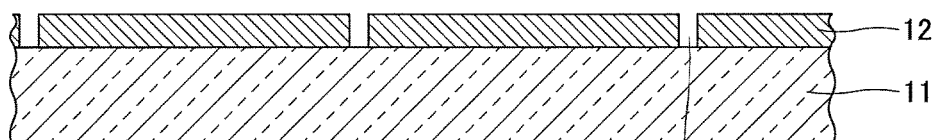
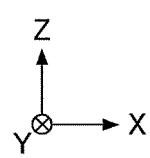
(c)
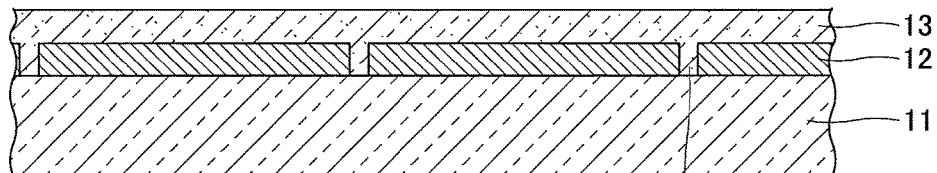
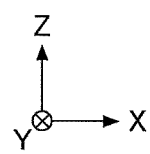

FIG.5
(a)
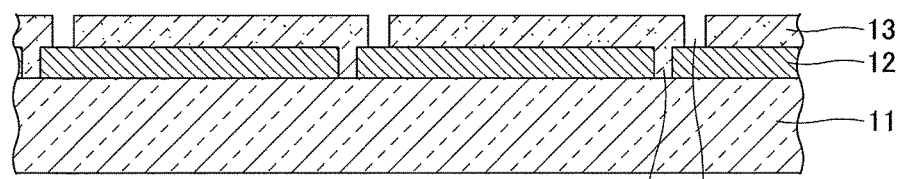
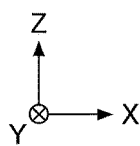
(b)
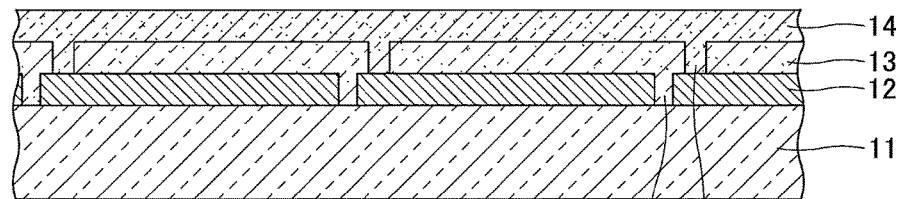
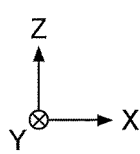

FIG.6
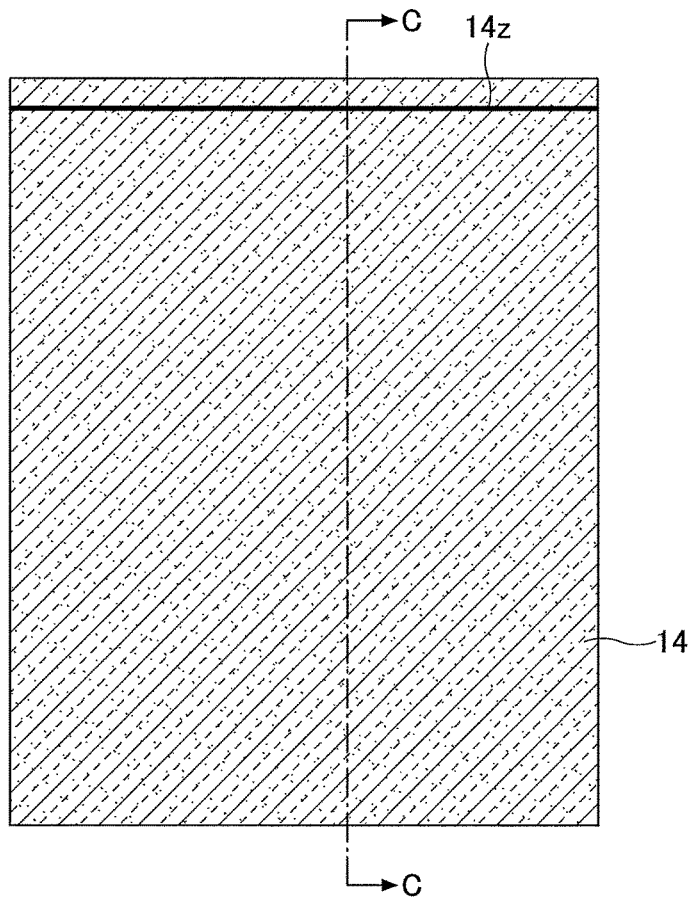
(a)
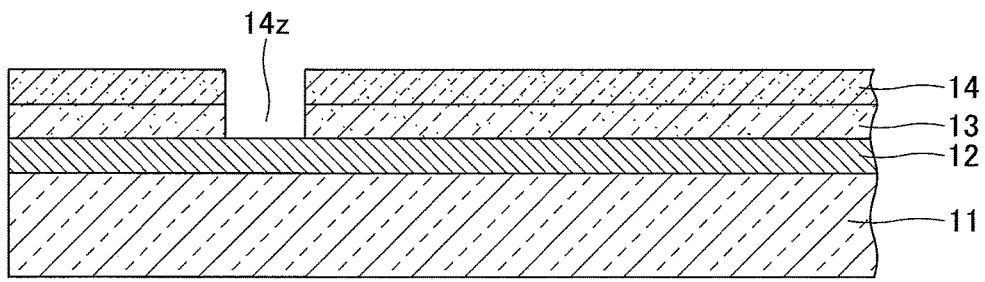
(b)
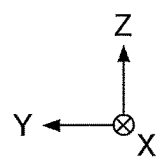

FIG.8
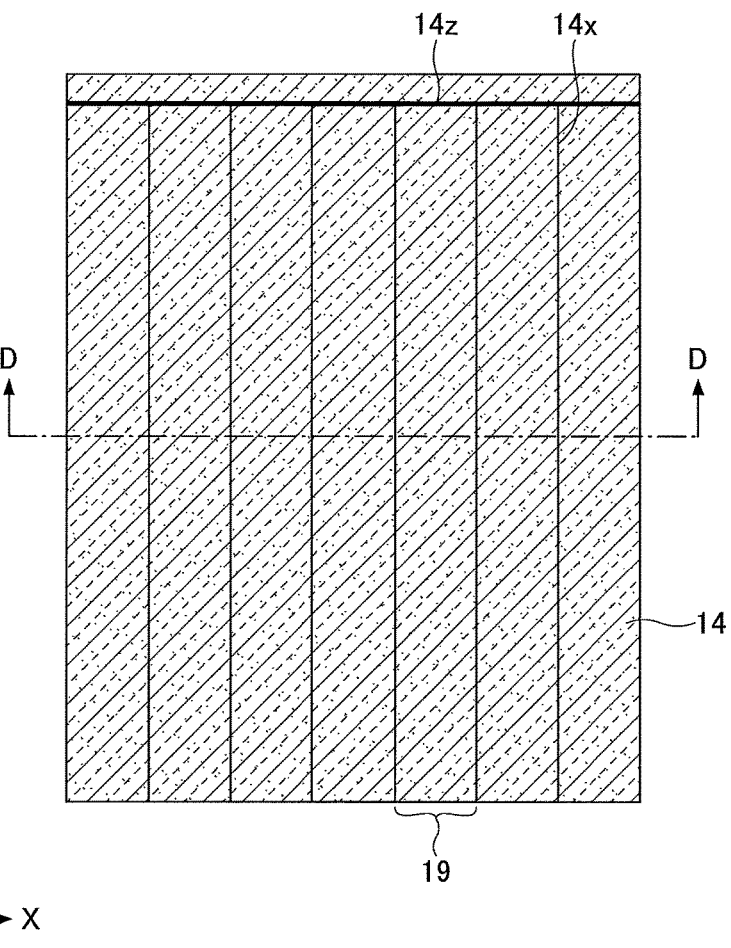
(a)
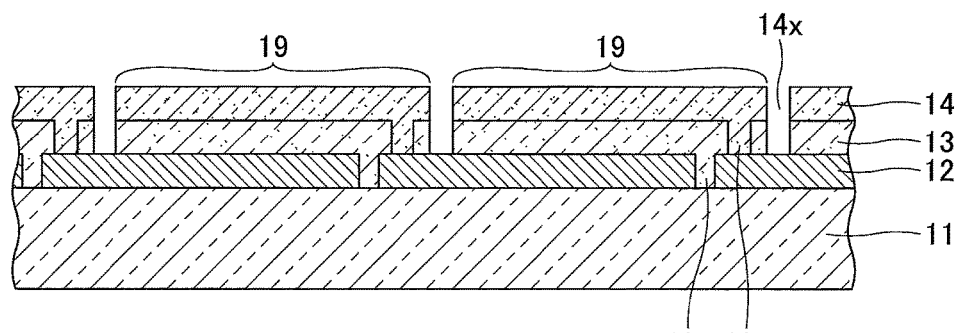
(b)

METHOD OF MANUFACTURING THIN-FILM SOLAR CELL

TECHNICAL FIELD

The present invention relates to a method of manufacturing a thin-film solar cell including multiple cells connected in series.

BACKGROUND ART

In recent years, solar photovoltaic power generation has been getting attention as an electric power generation technology that does not require fuel and does not emit greenhouse effect gas. As solar cells used for solar photovoltaic power generation, thin-film solar cells composed of thin silicon such as amorphous silicon or microcrystalline silicon, or a compound thin film such as a CIS thin film are known.

A typical thin-film solar cell has an integrated structure where a first electrode, a semiconductor layer, and a second electrode are stacked in this order on a substrate, these layers are divided by partition grooves into multiple cells, and these cells are connected in series to each other. For example, a method called mechanical scribing described below is used to form partition grooves by removing the semiconductor layer and the second electrode on the first electrode.

In the mechanical scribing, a scriber needle is placed on the second electrode at a position where a partition groove is to be formed, and a predetermined pressure is applied to the scriber needle such that a tip of the scriber needle penetrates through the second electrode and the semiconductor layer and touches a surface of the first electrode. Then, the scriber needle is moved horizontally to remove a linear part of the second electrode and the semiconductor layer on the first electrode to form a partition groove (see, for example, Patent Document 1).

RELATED-ART DOCUMENT

Patent Document

[Patent Document 1] Japanese Laid-Open Patent Publication No. 2005-191167

DISCLOSURE OF INVENTION

Problems to be Solved by the Invention

With the above method, however, it is difficult to control the pressure applied to the scriber needle. For example, when the pressure applied to the scriber needle is too high, the scriber needle penetrates through the first electrode and damages the substrate. On the other hand, when the pressure applied to the scriber needle is too low, the tip of the scriber needle does not reach the first electrode. When the scriber needle is moved horizontally in this state, a part of the semiconductor layer remains as a residual film and power generation efficiency is reduced.

The present invention is made taking into account the above problems of the related art. One object of the present invention is to provide a thin-film solar cell manufacturing method that can prevent a part of a layer, in which a partition groove is formed by mechanical scribing, from remaining as a residual film on a lower layer, and also prevent the lower layer from being damaged.

Means for Solving the Problems

A method of manufacturing a thin-film solar cell of an embodiment includes a first electrode forming step of forming a first electrode on a substrate; a first partition groove forming step of forming a first partition groove for dividing the first electrode and exposing a surface of the substrate in the first partition groove; a semiconductor layer forming step of forming a semiconductor layer on the first electrode and in the first partition groove; a second partition groove forming step of forming a second partition groove for dividing the semiconductor layer and exposing a surface of the first electrode in the second partition groove; a second electrode forming step of forming a second electrode on the semiconductor layer and in the second partition groove; and a third partition groove forming step of forming a third partition groove for dividing the second electrode and the semiconductor layer and exposing the surface of the first electrode in the third partition groove. At least one of the first partition groove forming step, the second partition groove forming step, and the third partition groove forming step includes an opening forming step of forming an opening in a partition groove forming layer where a partition groove is to be formed, by removing beforehand a part of the partition groove forming layer corresponding to a starting point from which the partition groove is formed, and thereby exposing a surface of a lower layer below the partition groove forming layer in the opening, and a partition groove forming step of bringing a needle into contact with the surface of the lower layer exposed in the opening and forming the partition groove by moving the needle in a predetermined direction.

Advantageous Effect of the Invention

The disclosed technology makes it possible to provide a thin-film solar cell manufacturing method that can prevent a part of a layer, in which a partition groove is formed by mechanical scribing, from remaining as a residual film on a lower layer, and also prevent the lower layer from being damaged.

BRIEF DESCRIPTION OF THE DRAWINGS

FIG. 4 is a drawing (1) exemplifying a process of manufacturing a CIS thin-film solar cell according to the first embodiment;

FIG. 5 is a drawing (2) exemplifying a process of manufacturing a CIS thin-film solar cell according to the first embodiment;

FIG. 6 is a drawing (3) exemplifying a process of manufacturing a CIS thin-film solar cell according to the first embodiment;

FIG. 8 is a drawing (5) exemplifying a process of manufacturing a CIS thin-film solar cell according to the first embodiment;

DESCRIPTION OF EMBODIMENTS

Embodiments of the present invention are described below with reference to the accompanying drawings. The same reference numbers are assigned to the same components throughout the drawings, and repeated descriptions of those components are omitted.

In the descriptions of the embodiments below, a CIS thin-film solar cell is used as an example. However, the present invention may also be applied to thin-film solar cells other than a CIS thin-film solar cell. Examples of thin-film solar cells to which the present invention can be applied include an amorphous silicon thin-film solar cell, a microcrystalline silicon thin-film solar cell, and compound thin-film solar cells including a CIS thin-film solar cell.

Compound thin-film solar cells other than a CIS thin-film solar cell include, for example, a CZTS thin-film solar cell whose semiconductor layer is comprised of a compound including copper (Cu), zinc (Zn), tin (Sn), and a chalcogen element (selenium (Se) or sulfur (S)), and a CdTe thin-film solar cell whose semiconductor layer is comprised of a compound including cadmium (Cd) and tellurium (Te).

First Embodiment

<Configuration of Cis Thin-Film Solar Cell According to First Embodiment>

Figure 1:
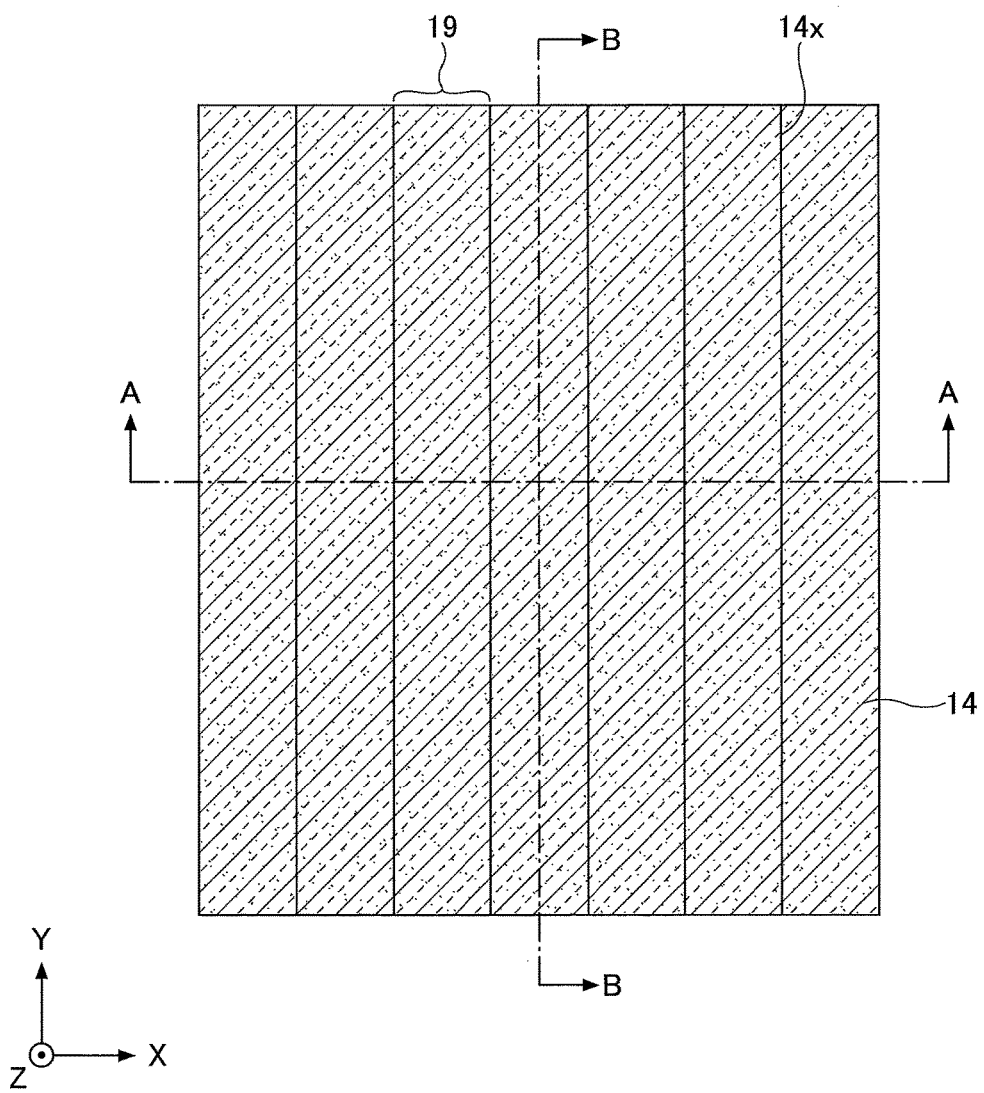
FIG. 1 is a plan view of an exemplary CIS thin-film solar cell according to a first embodiment.
Figure 2:
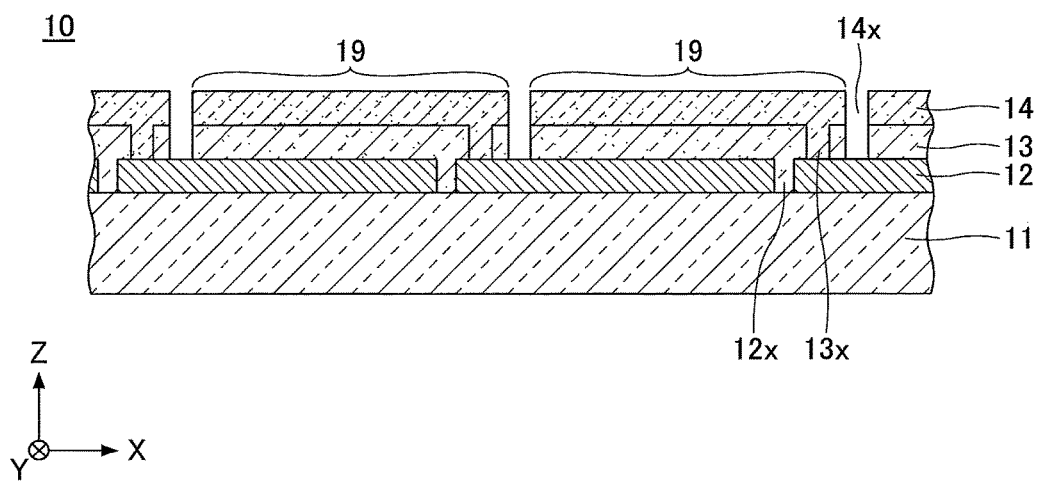
FIG. 2 is a partial cross-sectional view taken along line A-A of FIG. 1.
Figure 3:
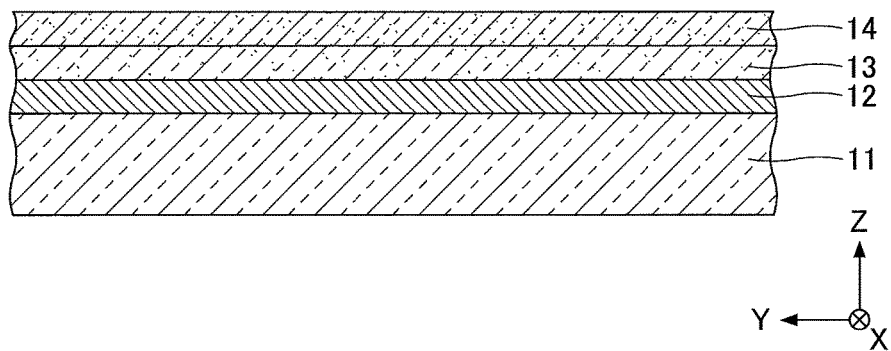
FIG. 3 is a partial cross-sectional view taken along line B-B of FIG. 1.

First, the configuration of a CIS thin-film solar cell according to a first embodiment is described. FIG. 1 is a plan view of an exemplary CIS thin-film solar cell according to the first embodiment. FIG. 2 is a partial cross-sectional view taken along line A-A of FIG. 1. FIG. 3 is a partial cross-sectional view taken along line B-B of FIG. 1.

In FIGS. 1-3, it is assumed that the CIS thin-film solar cell has a rectangular planar shape. Also, in plan view of the CIS thin-film solar cell (i.e., when seen from a light-receiving surface), the shorter direction is referred to as an X direction, the longer direction is referred to as a Y direction, and the thickness direction is referred to as a Z direction. For descriptive purposes, hatching corresponding to that in the cross-sectional views is applied also to the plan view.

Referring to FIGS. 1-3, a CIS thin-film solar cell 10 includes a substrate 11, a first electrode 12, a semiconductor layer 13, and a second electrode 14. The first electrode 12, the semiconductor layer 13, and the second electrode 14 are stacked in this order on the substrate 11. Components of the CIS thin-film solar cell 10 are described below.

The substrate 11 serves as a base on which the first electrode 12, the semiconductor layer 13, and the second electrode 14 are formed. The substrate 11 may be implemented by, for example, a glass substrate composed of glass such as soda lime glass or low-alkali glass, a metal substrate composed of a metal such as aluminum or stainless steel whose surface is insulated, or a resin substrate composed of a resin such as epoxy resin. The thickness of the substrate 11 may be, for example, about several mm.

The first electrode 12 is formed on the substrate 11. The first electrode 12 is divided by first partition grooves 12x formed along the Y direction. The width of the first partition grooves 12x may be, for example, about several tens µm to about several hundred µm. For example, the first electrode 12 may be comprised of molybdenum (Mo). Alternatively, the first electrode 12 may be comprised of titanium (Ti) or chromium (Cr) that is corrosive-resistant to selenium (Se) and sulfur (S). The thickness of the first electrode 12 may be, for example, about several tens nm to about several µm.

The semiconductor layer 13 is comprised of a p-type semiconductor, and is formed on the first electrode 12 and in the first partition grooves 12x. The semiconductor layer 13 is divided by second partition grooves 13x formed along the Y direction. The width of the second partition grooves 13x may be, for example, about several tens µm to about several hundred µm. The semiconductor layer 13 photoelectrically converts light such as sunlight. Electromotive force generated by photoelectric conversion by the semiconductor layer 13 can be extracted as an electric current via electrode ribbons (copper foil ribbons) (not shown) attached to the first electrode 12 and the second electrode 14 using, for example, solder.

The semiconductor layer 13 may be comprised of, for example, a compound including copper (Cu), indium (In), and selenium (Se), or a compound including copper (Cu), indium (In), gallium (Ga), selenium (Se), and sulfur (S). Examples of the compounds include $CuInSe_2$, $Cu(InGa)Se_2$, and $Cu(InGa)(SSe)_2$. The thickness of the semiconductor layer 13 may be, for example, about several µm to about several tens µm.

A buffer layer (not shown) may be formed on a surface of the semiconductor layer 13. The buffer layer is a high-resistance layer having a function to prevent leakage of an electric current from the semiconductor layer 13. Examples of materials of the buffer layer include a zinc compound, zinc sulfide (ZnS), cadmium sulfide (CdS), and indium sulfide (InS). The thickness of the buffer layer may be, for example, about several nm to about several tens nm.

The second electrode 14 is a transparent layer comprised of an n-type semiconductor, and is formed on the semiconductor layer 13 and in the second partition grooves 13x. For example, the second electrode 14 may be implemented by a transparent conductive film such as a zinc oxide (ZnO) thin film or an ITO thin film. When a zinc oxide (ZnO) thin film is used for the second electrode 14, a dopant such as boron (B), aluminum (Al), or gallium (Ga) is preferably added to the zinc oxide (ZnO) thin film to reduce its resistance. The thickness of the second electrode 14 may be, for example, about several µm to about several tens µm. The semiconductor layer 13 and the second electrode 14 form a pn junction.

The semiconductor layer 13 and the second electrode 14 are divided by third partition grooves 14x formed along the Y direction. The width of the third partition grooves 14x may be, for example, about several tens µm to about several hundred µm. Segments formed by dividing the semiconductor layer 13 and the second electrode 14 by the third partition grooves 14x form cells 19. The second electrode 14 formed in the second partition groove 13x of a cell 19 is electrically connected via the second partition groove 13x to the first electrode 12 of an adjacent cell 19. Thus, the cells 19 divided by the third partition grooves 14x are connected in series.

<Method of Manufacturing Cis Thin-Film Solar Cell According to First Embodiment>

Next, a method of manufacturing a CIS thin-film solar cell according to the first embodiment is described. FIGS. 4 through 9 are drawings exemplifying a process of manufacturing a CIS thin-film solar cell according to the first embodiment. FIGS. 4 and 5 are partial cross-sectional views corresponding to FIG. 2.

At a step illustrated by FIG. 4 (a), the first electrode 12 is formed on the substrate 11. More specifically, the substrate 11 is prepared first. The substrate 11 may be implemented by, for example, a glass substrate composed of glass such as soda lime glass or low-alkali glass, a metal substrate composed of a metal such as aluminum or stainless steel whose surface is insulated, or a resin substrate composed of a resin such as epoxy resin. The thickness of the substrate 11 may be, for example, several mm.

Next, the first electrode 12 is formed on the substrate 11 by, for example, sputtering. For example, the first electrode 12 may be comprised of molybdenum (Mo). Alternatively, the first electrode 12 may be comprised of titanium (Ti) or chromium (Cr) that is corrosive-resistant to selenium (Se) and sulfur (S). The thickness of the first electrode 12 may be, for example, about several tens nm to about several µm.

At a step illustrated by FIG. 4 (b), the first partition grooves 12x are formed along the Y direction to divide the first electrode 12. Parts of a surface of the substrate 11 are exposed in the first partition grooves 12x. For example, the first partition grooves 12x are formed by irradiating parts of the first electrode 12 with a pulse laser beam generated by a YAG laser and thereby removing the irradiated parts of the first electrode 12. Alternatively, the first partition grooves 12x may be formed mechanically using, for example, a needle instead of a laser (mechanical scribing). The width of the first partition grooves 12x may be, for example, about several tens µm to about several hundred µm.

At a step illustrated by FIG. 4 (c), the semiconductor layer 13 is formed on the first electrode and in the first partition grooves 12x. The semiconductor layer 13 may be formed, for example, by forming a precursor film including copper (Cu), gallium (Ga), and indium (In) by sputtering or vapor deposition, and by performing heat treatment on the precursor film in a selenium (Se) atmosphere, a sulfur (S) atmosphere, or a selenium (Se) and sulfur (S) atmosphere (selenization/sulfurization process).

The semiconductor layer 13 may also be formed by depositing copper (Cu), gallium (Ga), indium (In), and selenium (Se). Also, the semiconductor layer 13 may be formed by depositing copper (Cu), gallium (Ga), indium (In), and sulfur (S). Also, the semiconductor layer 13 may be formed by depositing copper (Cu), gallium (Ga), indium (In), selenium (Se), and sulfur (S).

A buffer layer may be formed on a surface of the semiconductor layer 13 as necessary. For example, the buffer layer may be formed on the surface of the semiconductor layer 13 using a material such as a crystal of CdS, InS, or In (O, S, OH); Zn (O, S, OH); ZnO; ZnS; or a crystal of Zn (O, S, OH), ZnO, or ZnS by a solution growth method (CBD method), a metal organic chemical vapor deposition (MOCVD) method, or an atomic layer deposition (ALD) method. The thickness of the buffer layer may be, for example, about several nm to about several tens nm.

At a step illustrated by FIG. 5 (a), the second partition grooves 13x are formed along the Y direction to divide the semiconductor layer 13. Parts of a surface of the first electrode 12 are exposed in the second partition grooves 13x. The second partition grooves 13x may be formed mechanically using, for example, a needle (mechanical scribing). Alternatively, the second partition grooves 13x may be formed by irradiating parts of the semiconductor layer 13 with a pulse laser beam generated by a YAG laser.

At a step illustrated by FIG. 5 (b), the second electrode 14 is formed on the semiconductor layer 13 and in the second partition grooves 13x. The second electrode 14 may be implemented by a transparent and low-resistance film such as a zinc oxide (ZnO) thin film to which a dopant such as boron (B), gallium (Ga), or aluminum (Al) is added, or an indium tin oxide (ITO) thin film, which is formed by an MOCVD method or sputtering. The thickness of the second electrode 14 may be, for example, about several µm to about several tens µm.

Next, at steps illustrated by FIG. 6 (a) and FIG. 6 (b), a preprocessing pattern 14z (opening) is formed by partially removing the semiconductor layer 13 and the second electrode 14 such that a part of a surface of the first electrode 12 is exposed in the preprocessing pattern 14z (opening). In the present embodiment, the preprocessing pattern 14z is formed as a linear groove that is parallel to the X direction and extends from one X-direction end to another X-direction end of the semiconductor layer 13 and the second electrode 14.

The preprocessing pattern 14z may be formed by irradiating parts of the semiconductor layer 13 and the second electrode 14 with a pulse laser beam generated by, for example, a YAG laser. Alternatively, the preprocessing pattern 14z may be formed mechanically using, for example, a needle instead of a laser (mechanical scribing). The width of the preprocessing pattern 14z may be, for example, about several µm to about several mm. A technical advantage of forming the preprocessing pattern 14z is described later. FIG. 6 (b) is a partial cross-sectional view taken along line C-C of FIG. 6 (a).

Figure 7:
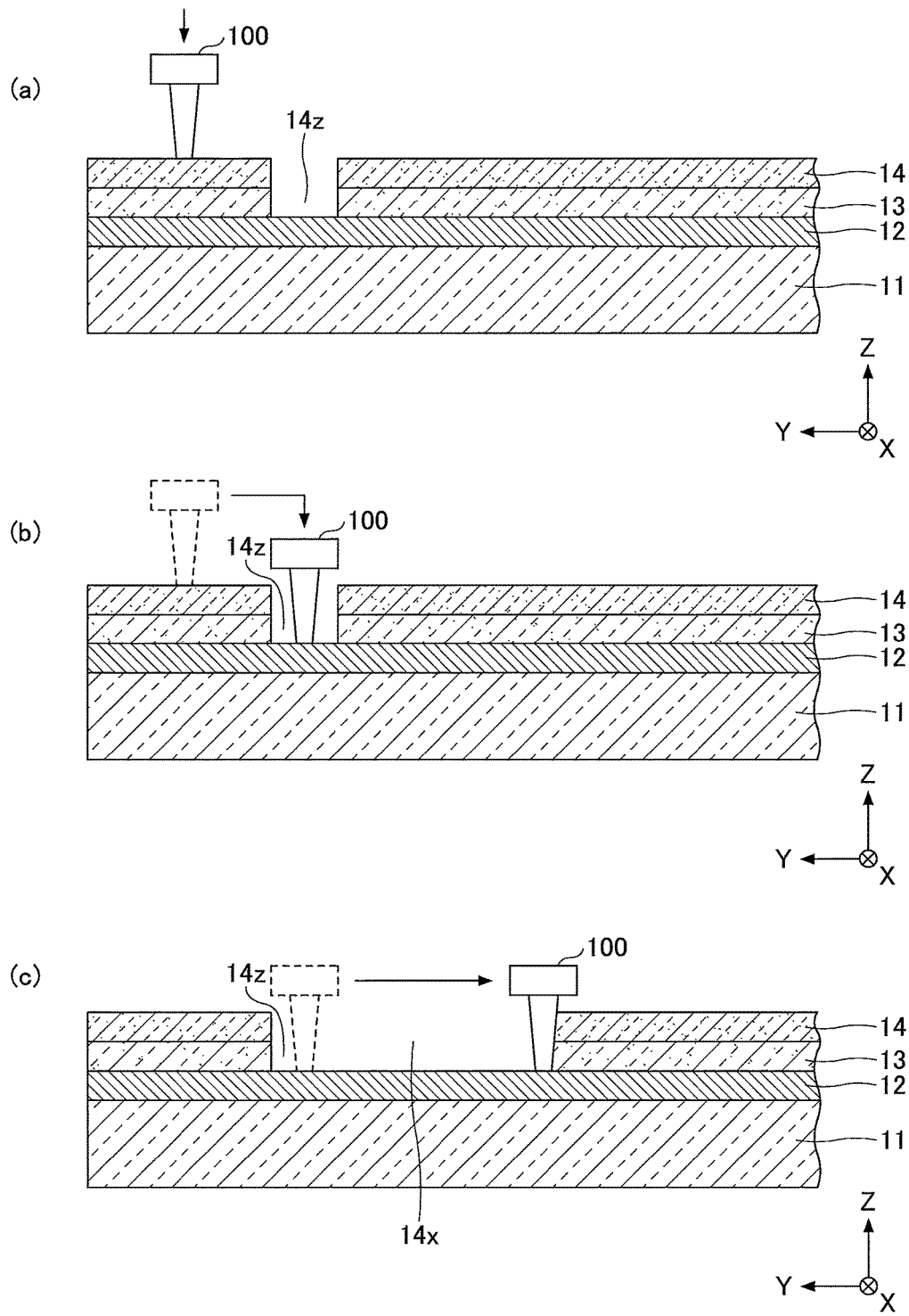
FIG. 7 is a drawing (4) exemplifying a process of manufacturing a CIS thin-film solar cell according to the first embodiment.

At steps illustrated by FIGS. 7 and 8, the third partition grooves 14x are formed along the Y direction to divide the semiconductor layer 13 and the second electrode 14. Parts of a surface of the first electrode 12 are exposed in the third partition grooves 14x.

More specifically, at a step illustrated by FIG. 7 (a), a needle 100 is prepared, and a tip of the needle 100 is brought into contact with a surface of the second electrode 14 at a position closer to the outer edge of the second electrode 14 than the preprocessing pattern 14z (or near the preprocessing pattern 14z). The pressure applied in this step to the needle 100 may be set at such a small value that the needle 100 does not penetrate through the second electrode 14.

Next, at a step illustrated by FIG. 7 (b), the needle 100 is moved in the Y direction and placed in the preprocessing pattern 14z to bring the tip of the needle 100 into contact with the surface of the first electrode 12 exposed in the preprocessing pattern 14z. The pressure applied in this step to the needle 100 may be set at such a small value that the needle 100 does not damage the surface of the first electrode 12. For example, a pressure that is substantially the same as the weight of the needle 100 may be applied. The step illustrated by FIG. 7 (a) may be omitted, and the step illustrated by FIG. 7 (b) may be performed immediately after the needle 100 is prepared.

At a step illustrated by FIG. 7 (c), the needle 100 is moved in the Y direction from the position illustrated in FIG. 7 (b) to remove parts of the semiconductor layer 13 and the second electrode 14 and thereby form a third partition groove 14x communicating with the preprocessing pattern 14z. The width of the third partition groove 14x may be, for example, about several tens µm to about several hundred µm. FIG. 7 (a) through FIG. 7 (c) are partial cross-sectional views corresponding to FIG. 6 (b).

Next, at steps illustrated by FIG. 8 (a) and FIG. 8 (b), the steps illustrated by FIG. 7 (a) through FIG. 7 (c) are repeated to form a desired number of (in this example, six) third partition grooves 14x communicating with the preprocessing pattern 14z (opening). By forming the third partition grooves 14x, multiple cells 19 are formed. The cells 19 are connected in series. FIG. 8 (b) is a partial cross-sectional view taken along line D-D of FIG. 8 (a).

Figure 9:
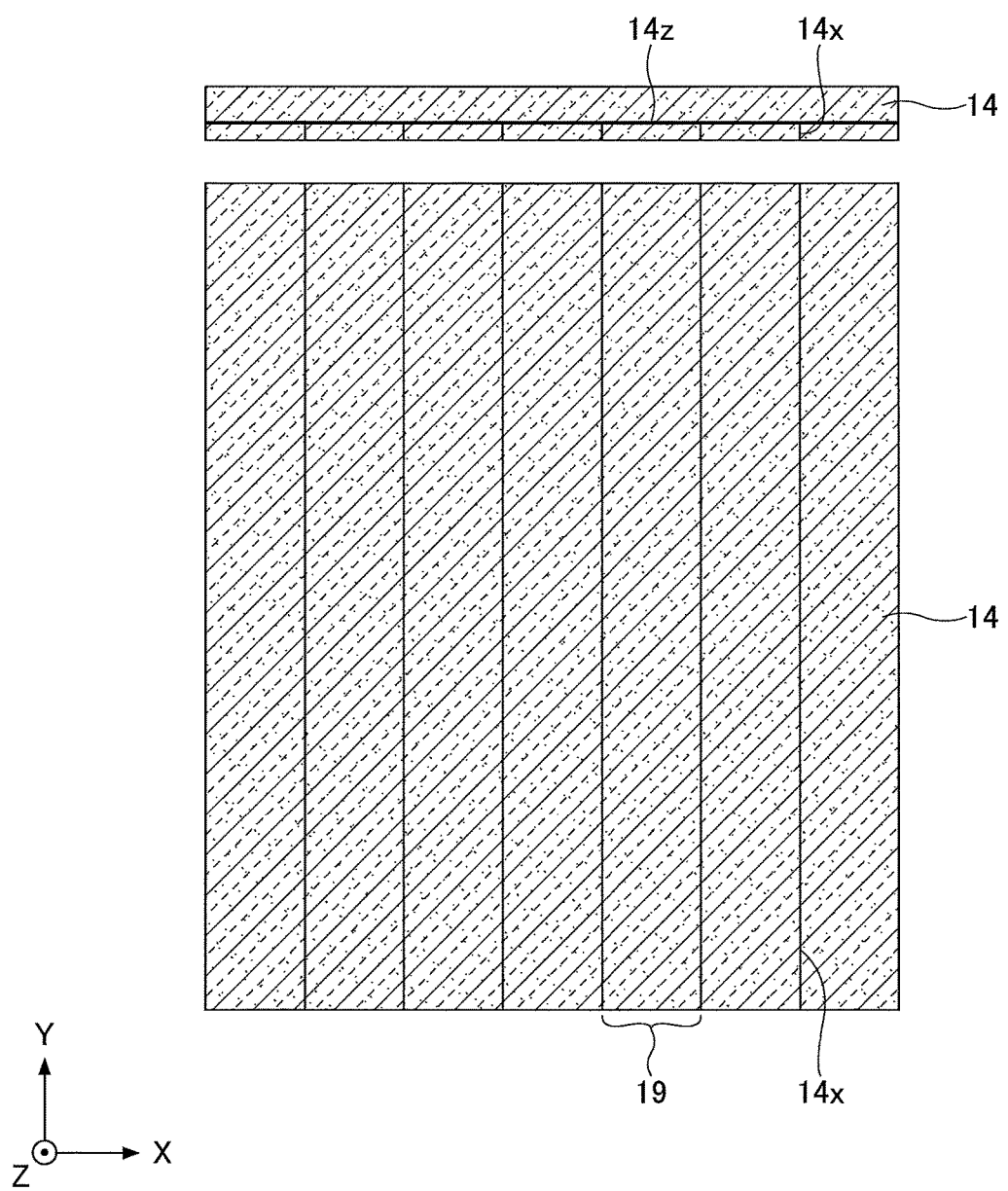
FIG. 9 is a drawing (6) exemplifying a process of manufacturing a CIS thin-film solar cell according to the first embodiment.

At a step illustrated by FIG. 9, a Y-direction end part, which includes the preprocessing pattern 14z, of the structure illustrated by FIG. 8 is cut off. As a result, the CIS thin-film solar cell 10 illustrated by FIGS. 1 through 3 is manufactured. The step illustrated by FIG. 9 is not essential, and the preprocessing pattern 14z may remain in the CIS thin-film solar cell 10. In this case, however, the part including the preprocessing pattern 14z remaining in the CIS thin-film solar cell 10 does not contribute to generation of power.

Next, a technical advantage of forming the preprocessing pattern 14z at the steps illustrated by FIG. 6 (a) and FIG. 6 (b) is described.

In the related art, the third partition groove 14x is formed, after the step of FIG. 5 (b), by placing the needle 100 at a position where the third partition groove 14x is to be formed, and by applying a predetermined pressure in the Z direction to the needle 100 such that the tip of the needle 100 penetrates through the second electrode 14 and the semiconductor layer 13 and touches the surface of the first electrode 12.

Because the total thickness of the second electrode 14 and the semiconductor layer 13 is very thin, e.g., about several μm to about several tens μm, it is difficult to control the pressure applied to the needle 100. As described above, when the pressure applied to the needle 100 is too high, the needle 100 penetrates through the first electrode 12 and damages (e.g., cracks) the substrate 11. On the other hand, when the pressure applied to the needle 100 is too low, the tip of the needle 100 does not reach the first electrode 12. When the needle 100 is moved horizontally in this state, a part of the semiconductor layer 13 remains as a residual film and power generation efficiency is reduced.

Also, to cause the tip of the needle 100 to reach the first electrode 12, it is necessary to apply, to the needle 100, a pressure that is sufficient to cause the needle 100 to penetrate through the semiconductor layer 13 and the second electrode 14. However, when the needle 100 is moved horizontally while the pressure is being applied, the needle 100 wears away quickly.

On the other hand, according to the present embodiment, the preprocessing pattern 14z is formed in advance (FIG. 6 (a) and FIG. 6 (b)), and the needle 100 is set on the first electrode 12 exposed in the preprocessing pattern 14z (FIG. 7 (a) and FIG. 7 (b)). This method eliminates the need to apply a pressure to the needle 100 to cause the needle 100 to penetrate through the semiconductor layer 13 and the second electrode 14.

Accordingly, compared with the related-art method, the method of the present embodiment makes it possible to reduce the pressure applied to the needle 100 and thereby makes it possible to prevent the substrate 11 from being damaged. Also in the present embodiment, the needle 100 is brought into contact with the surface of the first electrode 12 and then moved in the Y direction (FIG. 7 (c)). This makes it possible to prevent the semiconductor layer 13 from remaining as a residual film. Further, in the present embodiment, only a low pressure is applied to the needle 100 when the needle 100 is moved in the Y direction (FIG. 7 (c)). This makes it possible to reduce friction between the first electrode 12 and the needle 100, and thereby makes it possible to reduce abrasion of the tip of the needle 100.

In the present embodiment, the preprocessing pattern 14z is formed in an end part of the semiconductor layer 13 and the second electrode 14. However, the preprocessing pattern 14z may be formed at any position in the semiconductor layer 13 and the second electrode 14. For example, the preprocessing pattern 14z may be formed to pass through substantially the center of the semiconductor layer 13 and the second electrode 14. In this case, the needle 100 is moved from the preprocessing pattern 14z toward the respective Y-direction ends. Also in this case, a part of the structure including the preprocessing pattern 14z is not cut off.

<<First Variation of First Embodiment>>

In the example of the first embodiment, the preprocessing pattern 14z is formed before the third partition grooves 14x are formed. However, the preprocessing pattern may also be formed before the first partition grooves 12x are formed.

Specifically, after the first electrode 12 is formed at the step illustrated by FIG. 4 (a), the first electrode 12 is partially removed to form a preprocessing pattern that exposes a surface of the substrate 11 below the first electrode 12. For example, the preprocessing pattern is formed as a linear groove that is parallel to the X direction and extends from one X-direction end to another X-direction end of the first electrode 12. Next, the needle 100 is placed in the preprocessing pattern, and the tip of the needle 100 is brought into contact with the surface of the substrate 11 exposed in the preprocessing pattern. Then, the needle 100 in this state is moved in the Y direction to remove a part of the first electrode 12 and thereby form the first partition groove 12x.

Also, a preprocessing pattern may be formed before the second partition grooves 13x are formed. Specifically, after the semiconductor layer 13 is formed at the step illustrated by FIG. 4 (c), the semiconductor layer 13 is partially removed to form a preprocessing pattern that exposes a surface of the first electrode 12 below the semiconductor layer 13. For example, the preprocessing pattern is formed as a linear groove that is parallel to the X direction and extends from one X-direction end to another X-direction end of the semiconductor layer 13. Next, the needle 100 is placed in the preprocessing pattern, and the tip of the needle 100 is brought into contact with the surface of the first electrode 12 exposed in the preprocessing pattern. Then, the needle 100 in this state is moved in the Y direction to remove a part of the semiconductor layer 13 and thereby form the second partition groove 13x.

Also, a preprocessing pattern may be formed each time before the first partition grooves 12x are formed and before the second partition grooves 13x are formed. Also, a preprocessing pattern may be formed each time before the first partition grooves 12x are formed and before the third partition grooves 14x are formed. Also, a preprocessing pattern may be formed each time before the second partition grooves 13x are formed and before the third partition grooves 14x are formed.

Further, a preprocessing pattern may be formed each time before the first partition grooves 12x are formed, before the second partition grooves 13x are formed, and before the third partition grooves 14x are formed. When preprocessing patterns are formed for multiple types of partition grooves, the preprocessing patterns may be either formed to not overlap each other or formed to overlap each other. Also, the processing patterns may have the same width or different widths.

Thus, forming a preprocessing pattern before forming the first partition grooves 12x and/or before forming the second partition grooves 13x also makes it possible to provide advantageous effects similar to those provided by the first embodiment.

<<Second Variation of First Embodiment>>

In the example of the first embodiment, the preprocessing pattern 14z is formed as a linear groove that is parallel to the X direction and extends from one X-direction end to another X-direction end of the semiconductor layer 13 and the second electrode 14. Here, other examples of preprocessing patterns are described. Each of FIGS. 10 through 13 is a partial plan view corresponding to FIG. 8 (a).

Figure 10:
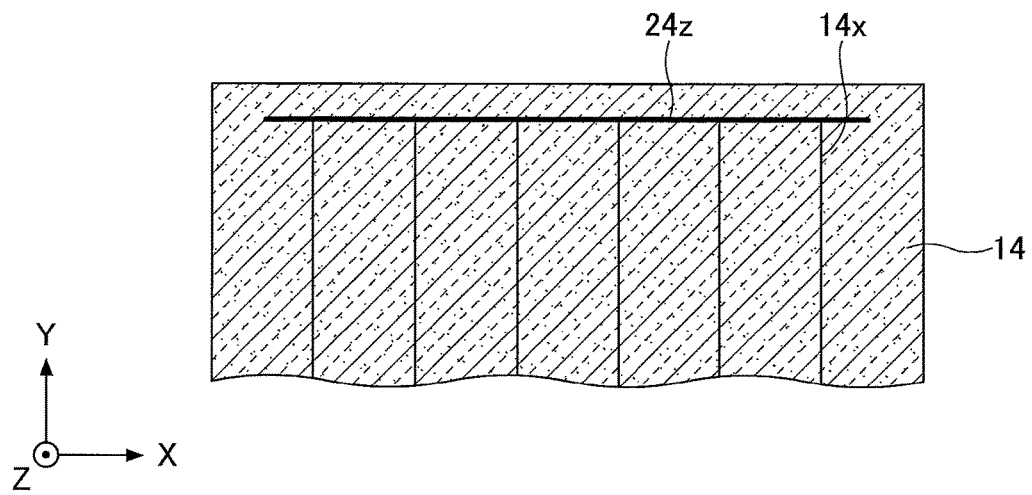
FIG. 10 is a drawing (1) exemplifying a variation of a preprocessing pattern.

FIG. 10 illustrates an exemplary preprocessing pattern 24z. The width and the extending direction of the preprocessing pattern 24z are the same as those of the preprocessing pattern 14z (see FIG. 8). The preprocessing pattern 24z is different from the preprocessing pattern 14z (see FIG. 8) in that openings are not formed at the X-direction ends of the semiconductor layer 13 and the second electrode 14.

Figure 11:
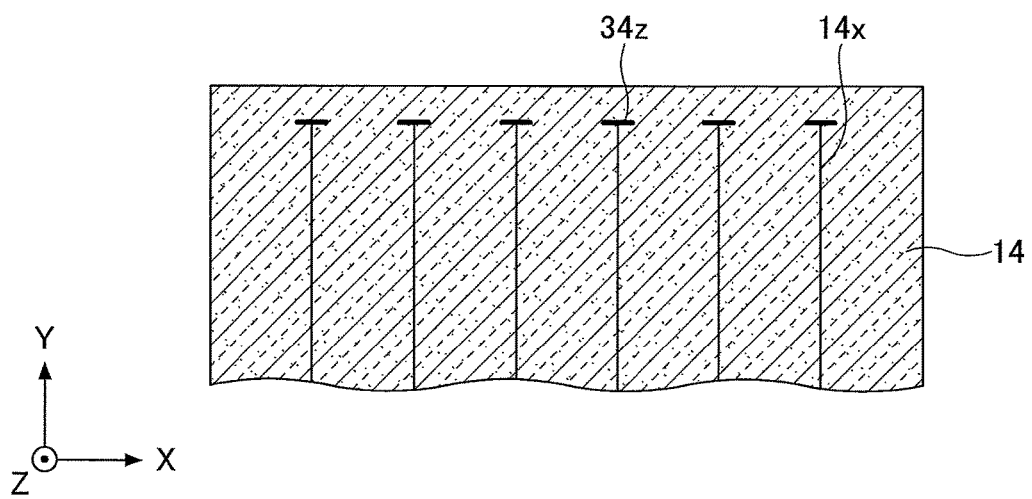
FIG. 11 is a drawing (2) exemplifying a variation of a preprocessing pattern.
Figure 12:
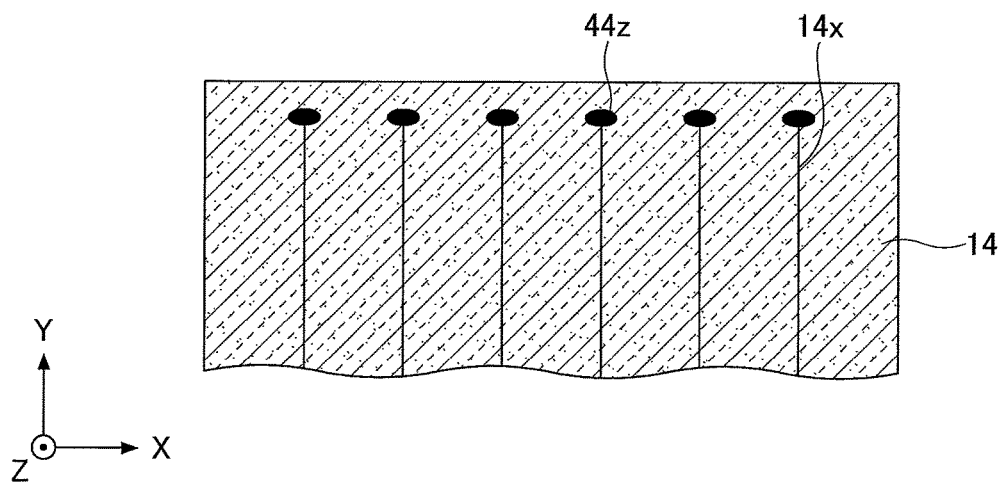
FIG. 12 is a drawing (3) exemplifying a variation of a preprocessing pattern.

FIG. 11 illustrates another exemplary preprocessing pattern 34z. The width and the extending direction of the preprocessing pattern 34z are the same as those of the preprocessing pattern 14z (see FIG. 8). The preprocessing pattern 34z is different from the preprocessing pattern 14z (see FIG. 8) in that openings are formed discretely (or discontinuously) only at starting points in the semiconductor layer 13 and the second electrode 14 at which the needle 100 is to be placed. In this case, the openings may have a rectangular plan shape as those of the preprocessing pattern 34z. Also, the openings may have an oval shape as those of a preprocessing pattern 44z illustrated in FIG. 12. Further, the openings may have any other shape such as a circular shape (not shown).

Figure 13:
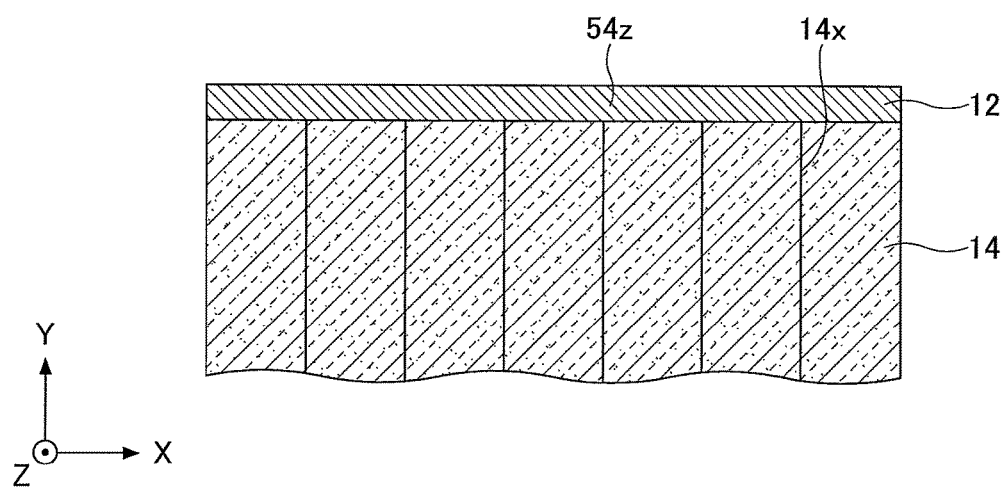
FIG. 13 is a drawing (4) exemplifying a variation of a preprocessing pattern.

FIG. 13 illustrates another exemplary preprocessing pattern 54z. The preprocessing pattern 54z is implemented by a Y-direction end part of the first electrode 12 which is predefined as an area where the semiconductor layer 13 and the second electrode 14 are not formed and is exposed at a time when the third partition grooves 14x are formed. For example, the preprocessing pattern 54z may be formed by masking the Y-direction end part of the first electrode 12 after the step illustrated by FIG. 4 (b) and then proceeding to the next step. Also, similarly to the preprocessing pattern 24z, the preprocessing pattern 54z may be formed such that openings are not formed at the X-direction ends of the semiconductor layer 13 and the second electrode 14. Further, similarly to the preprocessing patterns 34z and 44z, the preprocessing pattern 54z may be formed as discretely arranged openings.

Thus, a preprocessing pattern may have any form as long as openings are formed at starting points at which the needle 100 is placed. This also applies to preprocessing patterns used to form the first partition grooves 12x and the second partition grooves 13x.

Preferred embodiments and their variations are described above. However, the present invention is not limited to the specifically disclosed embodiments and variations, and modifications and replacement may be made without departing from the scope of the present invention.

For example, although partition grooves are formed by moving the needle 100 in the above embodiments and the variations, the substrate 11 may be moved instead of the needle 100 to form partition grooves. In this case, a table of an apparatus on which the substrate 11 is mounted may be moved.

The present international application is based on and claims the benefit of priority of Japanese Patent Application No. 2012-198904 filed on Sep. 10, 2012, the entire contents of which are hereby incorporated herein by reference.

EXPLANATION OF REFERENCES

10 CIS thin-film solar cell
11 Substrate
12 First electrode
12x, 13x, 14x Partition groove
13 Semiconductor layer
14 Second electrode
14z, 24z, 34z, 44z, 54z Preprocessing pattern
19 Cell
100 Needle

The invention claimed is:

1. A method of manufacturing a thin-film solar cell, the method comprising:
   forming a first electrode on a substrate;
   forming a first partition groove for dividing the first electrode and exposing a surface of the substrate in the first partition groove;
   forming a semiconductor layer on the first electrode and in the first partition groove;
   forming a second partition groove for dividing the semiconductor layer and exposing a surface of the first electrode in the second partition groove;
   forming a second electrode on the semiconductor layer and in the second partition groove; and
   forming a third partition groove for dividing the second electrode and the semiconductor layer and exposing the surface of the first electrode in the third partition groove,
   wherein at least one of the forming of the first partition groove, the forming of the second partition groove, and the forming of the third partition groove includes
      forming a predetermined preprocessing pattern in a partition groove forming layer where a partition groove is to be formed, by removing beforehand a part of the partition groove forming layer corresponding to a starting point from which the partition groove is formed, and thereby exposing a surface of a lower layer below the partition groove forming layer in the formed preprocessing pattern,
      inserting a needle into the formed preprocessing pattern where the surface of the lower layer is exposed and bringing the needle into contact with the surface of the lower layer exposed in the formed preprocessing pattern, and
      forming the partition groove by moving the needle in a predetermined direction; and
   wherein the preprocessing pattern is one of a linear groove extending in another predetermined direction and multiple openings arranged along the another predetermined direction, the another predetermined direction being orthogonal to the predetermined direction.

2. The method as claimed in claim 1, wherein the at least one of the forming of the first partition groove, the forming of the second partition groove, and the forming of the third partition groove includes cutting a part including the preprocessing pattern after forming the partition groove.

3. The method as claimed in claim 1, wherein the preprocessing pattern is formed by mechanical scribing.

4. The method as claimed in claim 1, wherein the forming of the preprocessing pattern is performed between the forming of the second electrode and the forming of the third partition groove to expose the surface of the first electrode in the preprocessing pattern.

5. The method as claimed in claim 1, wherein the forming of the preprocessing pattern is performed between the forming of the semiconductor layer and the forming of the second partition groove to expose the surface of the first electrode in the preprocessing pattern.

6. The method as claimed in claim 1, wherein the forming of the preprocessing pattern is performed between the forming of the first electrode and the forming of the first partition groove to expose the surface of the substrate in the preprocessing pattern.

7. The method as claimed in claim 1, wherein
the substrate is a glass substrate;
the first electrode functions as a back electrode;
the semiconductor layer is comprised of a compound semiconductor; and
the second electrode is a transparent conductive film.

* * * * *